United States Patent
Gibbs et al.

(10) Patent No.: US 10,951,111 B2
(45) Date of Patent: Mar. 16, 2021

(54) APPARATUS, METHODS AND COMPUTER PROGRAM PRODUCTS FOR INVERTER SHORT CIRCUIT DETECTION

(71) Applicant: Eaton Intelligent Power Limited, Dublin (IE)

(72) Inventors: Irving A. Gibbs, Mills River, NC (US); Gabriel Braga, Belo Horizonte (BR)

(73) Assignee: Eaton Intelligent Power Limited

( * ) Notice: Subject to any disclaimer, the term of this patent is extended or adjusted under 35 U.S.C. 154(b) by 59 days.

(21) Appl. No.: 15/881,004

(22) Filed: Jan. 26, 2018

(65) Prior Publication Data

US 2019/0238047 A1 Aug. 1, 2019

(51) Int. Cl.
| | |
|---|---|
| *H02M 1/32* | (2007.01) |
| *H02M 7/487* | (2007.01) |
| *H02M 7/5395* | (2006.01) |
| *G01R 31/40* | (2020.01) |
| *G01R 31/26* | (2020.01) |
| *H02P 27/08* | (2006.01) |
| *G01R 31/42* | (2006.01) |
| *H02M 7/5387* | (2007.01) |

(52) U.S. Cl.
CPC .......... *H02M 1/32* (2013.01); *G01R 31/2601* (2013.01); *G01R 31/2608* (2013.01); *G01R 31/40* (2013.01); *G01R 31/42* (2013.01); *H02M 7/487* (2013.01); *H02M 7/5395* (2013.01); *H02P 27/08* (2013.01); *H02M 2007/53876* (2013.01)

(58) Field of Classification Search
USPC ........................................................ 318/490
See application file for complete search history.

(56) References Cited

U.S. PATENT DOCUMENTS

| | | | |
|---|---|---|---|
| 5,304,935 A | 4/1994 | Rathke et al. | |
| 5,500,616 A | 3/1996 | Ochi | |
| 5,687,049 A * | 11/1997 | Mangtani | H02H 7/1227 |
| | | | 361/18 |
| 5,910,892 A | 6/1999 | Lyons et al. | |
| 6,058,031 A | 5/2000 | Lyons et al. | |
| 6,369,543 B1 * | 4/2002 | Masselus | H02H 7/1225 |
| | | | 318/700 |
| 8,503,146 B1 * | 8/2013 | Shekhawat | H03K 17/0812 |
| | | | 361/93.9 |

(Continued)

*Primary Examiner* — Jorge L Carrasquillo
(74) *Attorney, Agent, or Firm* — Stanek Lemon Crouse & Meeks, P.A.

(57) ABSTRACT

An apparatus includes an inverter configured to be connected to a load, a driver having an output coupled to control terminals of transistors of the inverter and a control input configured to receive control vectors and responsively apply control signals to control terminals of the inverter, a desaturation detector configured to detect desaturation of the transistors, and a controller coupled to the control input of the driver and configured to apply at least one test vector that causes the driver to turn on selected ones of the transistors for a duration sufficient for the desaturation detector to detect desaturation of at least one of the selected transistors and to enable or inhibit further operation of the inverter responsive to the desaturation detector. The load may be a motor and the controller may be configured to apply the at least one test vector responsive to a command to start the motor.

12 Claims, 4 Drawing Sheets

(56) References Cited

U.S. PATENT DOCUMENTS

| | | | |
|---|---|---|---|
| 2005/0281065 A1* | 12/2005 | Nojima | H02M 1/38 363/98 |
| 2008/0304189 A1* | 12/2008 | Tang | H02H 7/0838 361/33 |
| 2014/0092503 A1* | 4/2014 | Ostrovsky | H02H 3/044 361/45 |
| 2014/0233278 A1* | 8/2014 | Li | H02M 7/53873 363/37 |
| 2016/0282407 A1* | 9/2016 | Bacigalupo | G01R 31/2621 |
| 2018/0097515 A1* | 4/2018 | Norling | H03K 17/08126 |

* cited by examiner

APPARATUS, METHODS AND COMPUTER PROGRAM PRODUCTS FOR INVERTER SHORT CIRCUIT DETECTION

BACKGROUND

The inventive subject matter relates to control of inverters, such as inverters used in adjustable frequency drives.

Adjustable frequency drives (AFDs) (also referred to as variable frequency drives and variable speed drives) are commonly used to control AC motor speed in motor drive applications. AFDs typically use inverters that are coupled to DC buses powered by an AC/DC converter (e.g., a rectifier). AFDs commonly use multilevel neutral-point clamped (NPC) inverters, particularly for applications in which relatively large output voltages are required. U.S. Pat. No. 5,910,892 to Lyons et al. and U.S. Pat. No. 6,058,031 to Lyons et al. describe motor drives that include multilevel NPC inverters.

AFDs typically include some sort of overload and short circuit protection. For example, many AFDs detect short circuits on the inverter output by detecting desaturation of power transistors in the inverter. Techniques for detecting desaturation of power transistors are described, for example, in U.S. Pat. No. 5,304,935 to Rathke et al. and U.S. Pat. No. 5,500,616 to Ochi. Some AFDs include gate drivers that receive drive commands from a microprocessor or microcontroller and generate power transistor gate drive signals in response thereto. Such gate drivers may include integrated desaturation detection circuitry that measures a voltage (e.g., a collector-to-emitter voltage in an IGBT) across the power transistor and signals an overcurrent condition when the voltage exceeds a threshold indicating desaturation of the transistor. The AFD can then inhibit further operation of the inverter to prevent damage to the inverter transistors.

SUMMARY

Some embodiments of the inventive subject matter provide an apparatus including an inverter configured to be connected to a load and a driver having an output coupled to control terminals of transistors of the inverter and a control input configured to receive control vectors and responsively apply control signals to control terminals of the inverter. The apparatus further includes a desaturation detector configured to detect desaturation of the transistors and a controller coupled to the control input of the driver and configured to apply at least one test vector that causes the driver to turn on selected ones of the transistors for a duration sufficient for the desaturation detector to detect desaturation of at least one of the selected transistors and to enable or inhibit further operation of the inverter responsive to the desaturation detector. In some embodiments, the controller may be configured to apply control vectors responsive to a command input and an output feedback to control a voltage generated by the inverter, and the controller may be further configured to apply the at least one test vector irrespective of the command input and the output feedback. The load may be a motor and the controller may be configured to apply the at least one test vector responsive to a command to start the motor.

In some embodiments, the inverter may include a three-level inverter having first, second and third legs, each comprising first, second, third and fourth transistors coupled between first and second DC buses, respective ones of the first, second and third legs coupled to respective first, second and third phases. The controller may be configured to apply spaced-apart first and second test vectors to the driver that turn on respective first and second groups of the transistors and to inhibit further operation of the inverter in response to the desaturation detector detecting desaturation of at least one transistor of the first and second groups. The first test vector may enable detection of a fault between the first phase and the second phase or a fault between the first phase and the third phase, and the second test vector may enable detection of a fault between the third phase and the second phase or a fault between the third phase and the first phase.

Further embodiments provide methods of operating an adjustable frequency drive comprising an inverter configured to be connected to first, second and third phases of a load and a desaturation detector configured to detect desaturation of transistors of the inverter. The methods include a controller applying at least one test vector that causes a driver of the inverter to turn on selected ones of the transistors of the inverter for a test interval having a duration sufficient to detect desaturation of at least one of the selected transistors and enabling or disabling further operation of the inverter responsive to the desaturation detector.

DETAILED DESCRIPTION

Figure 1:
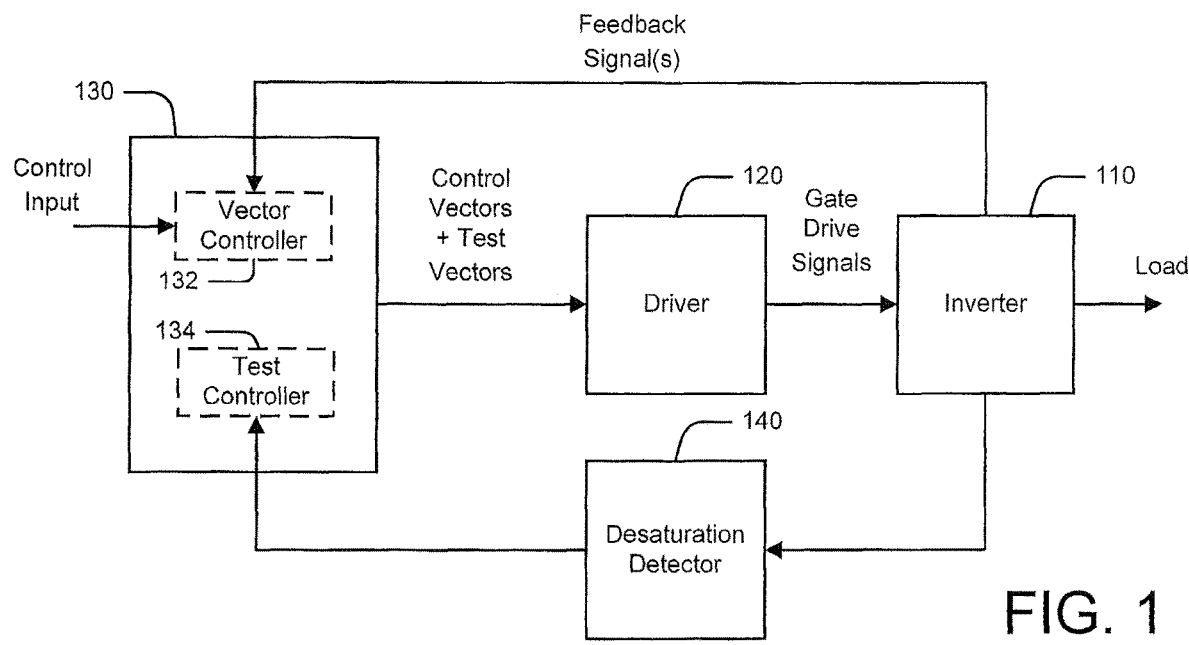
FIG. 1 is a schematic diagram illustrating an apparatus according to some embodiments.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like items. It will be understood that when an item is referred to as being "connected" or "coupled" to another item, it can be directly connected or coupled to the other item or intervening items may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, items, and/or components, but do not preclude the presence or addition of one or more other features, integers, steps, operations, items, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

Flowchart illustrations and/or block diagrams described herein may embody methods, apparatus (systems) and computer program products. It will be understood that each block of the flowchart illustrations and/or block diagrams, and combinations of blocks in the flowchart illustrations and/or block diagrams, can be implemented by computer program instructions. These computer program instructions may be provided to one or more processors, such as one or more processors of a general purpose computer, special purpose computer or other device to implement methods and machines that perform the functions/acts specified in the flowchart and/or block diagram block or blocks. Such computer program instructions may also be stored in a non-transitory computer readable medium that constitutes an article of manufacture including instructions that, when executed on a computer, data processing apparatus, and/or other devices, implements the function/act specified in the flowchart and/or block diagram block or blocks.

Some embodiments of the inventive subject matter arise from a realization that AFDs may have operational modes that can mask the presence of a short circuit or other fault because detection circuitry fails to quickly detect the presence of the fault. The failure to quickly detect the fault can lead to stress on the AFD inverter transistors, often leading to failure. For example, in some motor drive applications, an AFD with a pulse width modulated (PWM) inverter operating at a low commanded frequency with a shorted inverter output may use control vectors that cause inverter pulse widths that are insufficiently long enough to allow detection of transistor desaturation. Due to the failure to detect desaturation, protection systems that disable the inverter may not be reliability triggered. This can result in inverter transistors being repeatedly stressed, hastening device failure. According to some embodiments of the inventive subject matter, such problems may be avoided by applying one or more test vectors (e.g., upon startup) to an inverter gate driver, wherein the one or more test vectors produce inverter pulses that support fault currents and are sufficiently long enough to enable desaturation detection. In response to detecting desaturation in response to such a test vector, further operation of the inverter may be inhibited to reduce the likelihood of transistor damage. If application of such test vectors does not produce desaturation, the drive may transition to operating in a normally controlled fashion, e.g., as part of a control loop that causes the inverter to produce a desired output at a load.

Figure 2:
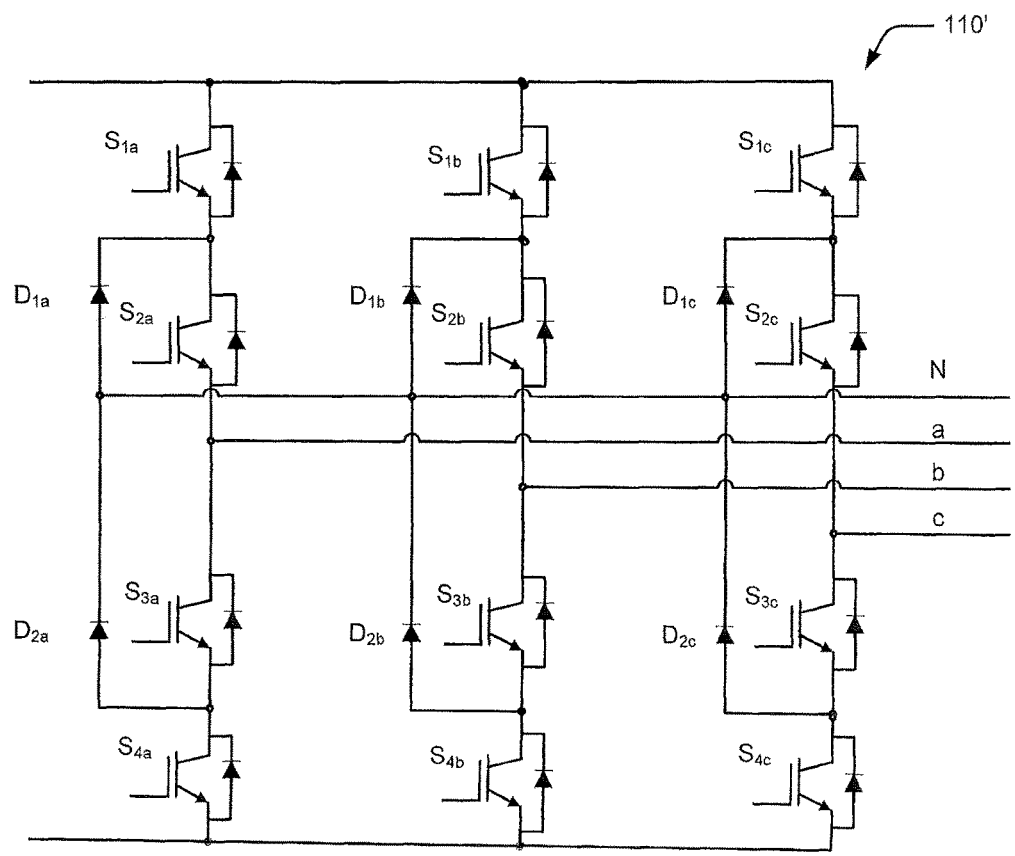
FIG. 2 is a schematic diagram illustrating a neutral-point-clamped (NPC) multilevel inverter structure suitable for use in the apparatus of FIG. 1.

FIG. 1 illustrates portions of an AFD according to some embodiments. An inverter 110 is configured to apply an output voltage to a load responsive to gate drive signals produced by a driver 120. Referring to FIG. 2, the inverter 110 of FIG. 1 may be a three-phase, three-level neutral point clamped (NPC) inverter 110' including three switch legs, one for each of phases a, b, c. Each switch leg may include a pair or of outer switches (S1$a$/S4$a$, S1$b$/S4$b$, S1$c$/S4$c$) and a pair of inner switches (S2$a$/S3$a$, S2$b$/S3$b$, S2$c$/S3$c$), here shown as insulated gate bipolar transistors (IGBTs). Nodes between the inner and outer transistors are coupled to a neutral N by clamping diodes D1$a$, D1$b$, D2$a$, D2$b$, D1$c$, D2$c$. It will be appreciated that the inverter 110 may take other forms, such as a higher order multilevel inverter (e.g., 5 or 7 level) and/or an inverter that uses another types of switching device (e.g., power MOSFETs).

A controller 130 is configured to generate vectors that are provided to the driver 120, which responsively generates the gate drive signals. As shown, the controller 130 may implement a vector controller 132, which generates control vectors responsive to a command signal (e.g., a voltage command) and one or more feedback signals (e.g., voltage and/or current feedback signals) as part of a closed loop control system that produces a desired output voltage and/or current. As further shown, the controller 130 may further implement a test controller 134, which is configured to generate one or more test vectors irrespective of the current input command and feedback signals, which, in some embodiments, may be used for detection of short circuits or other faults. In particular, the test vectors may have a configuration, i.e., may turn on particular transistors of the inverter for particular durations to support fault current conduction for a time sufficient to enable detection of transistor desaturation. Such desaturation may be detected, for example, using a desaturation detector 140. The test controller 134 may be configured to inhibit operation of the inverter 110 responsive to the desaturation detector 140 detecting desaturation of at least one transistor of the inverter 110 in response to the one or more test vectors.

The controller 130 may include, for example, one or more data processing devices, such as a microprocessor or a microcontroller, along with ancillary digital and/or analog circuitry (e.g., memory, signal processing circuitry, etc.) that interfaces with such devices. The driver 120 may be implemented using analog and/or digital circuitry and may, for example, be implemented using one or more special purpose integrated circuits. The desaturation detector 140 may be implemented using analog and/or digital circuitry and may, for example, be integrated in one or more integrated circuits that also implement the driver 120.

Figure 3:
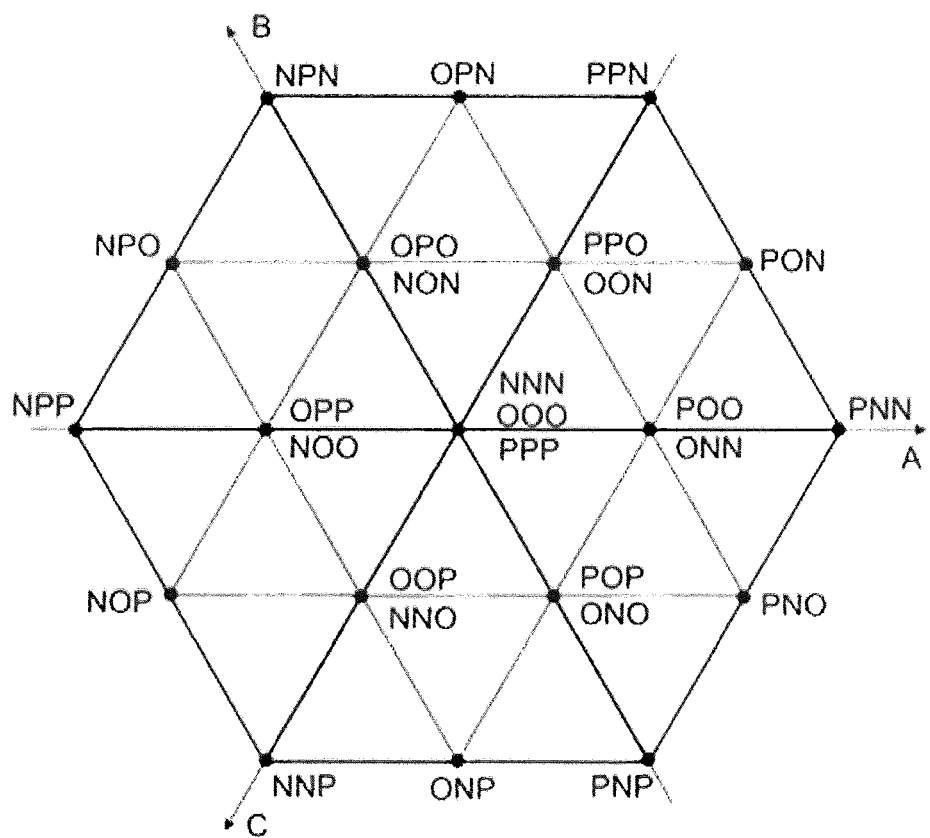
FIG. 3 is diagram illustrating vectors that may be generated by a controller of the apparatus of FIG. 1.

FIG. 3 is a space vector diagram illustrating vectors that may be used by a vector controller (e.g., the vector controller 132 of FIG. 1) for operation of a three-level inverter (e.g., the inverter illustrated in FIG. 2). Considering that each phase has three different switching states (P, O and N), the three-level inverter of FIG. 2 has 27 possible switching states, which can be represented by a hexagon. The switching states correspond to voltage vectors that can be applied to the load driven by the inverter.

As noted above, conventional vector controller may not produce pulses of sufficient duration to detect a fault. For example, in response to a "Run" command, a controller in a conventional adjustable frequency drive may apply a short DC start pulse. Due to dead time requirements for switching of the inverter transistors, however, only a portion of the start pulse interval may provide a real voltage drop across the load. In case of a short circuit in the load, it may take a longer time than this to detect a desaturation condition in the IGBTs of the inverter. In addition, when the conventional vector controller is producing small vectors having less than a certain duration, desaturation detection may not work and a load short circuit may go undetected for an extended period of operation. During such low frequency operation, IGBTs in the inverter may be repeatedly stressed using small control vectors until the current gets high enough to detect desaturation and disable the drive. Because of the significant energy dissipated in the IGBT junctions, the IGBTs may be stressed and may ultimately fail.

Figure 4:
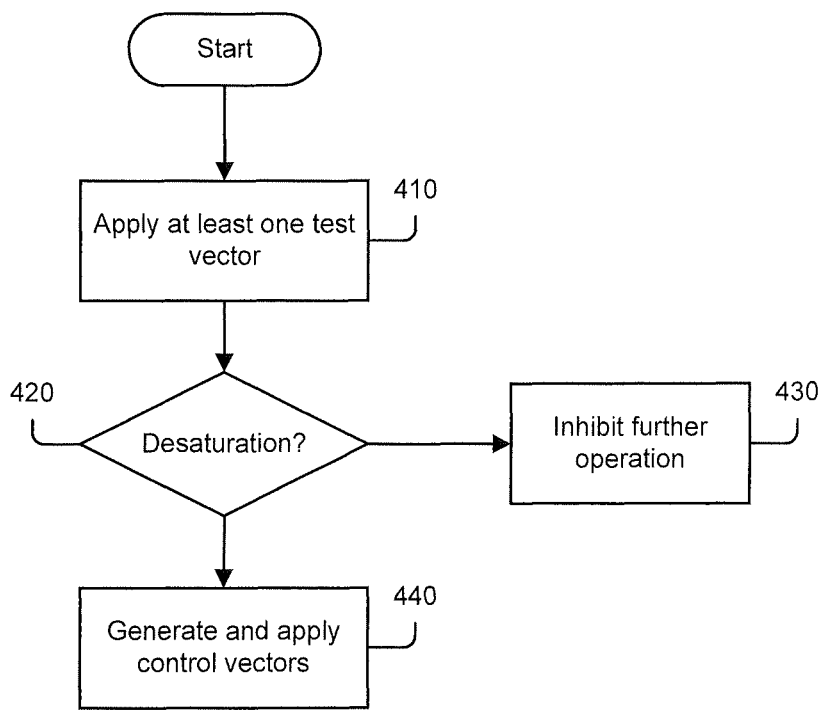
FIG. 4 is a flowchart illustrating operations of the apparatus of FIG. 1 according to some embodiments.

Some embodiments can limit or prevent operation with such an undetected fault condition by initially testing the output conditions by using test vectors that have a configuration and duration that can improve the likelihood of desaturation detection in the presence of an output fault. Referring to FIGS. 1 and 4, the test controller 134 according to some embodiments may apply at least one test vector that is configured to turn on selected switches of the inverter 110 in a manner that supports conduction of a short circuit current for a duration sufficient to enable detection of desaturation of at least one of the selected switches (block 410). The test vector is independent of the current command and feedback signals being received by the controller 130. If desaturation of at least one of the switches occurs in response to the test vector, further operation of the inverter 110 may be inhibited (blocks 420, 430). If no desaturation is detected, the vector controller 132 may proceed to apply control vectors in a normal control mode, e.g., by generating the control vectors responsive to a command input and output feedback signals. It will be appreciated that the configuration and duration of the test vectors may generally depend on various parameters associated with the inverter's operation. These may include, for example, the type of power switches being used and the response time of the particular desaturation detection circuitry being used.

Figure 5:
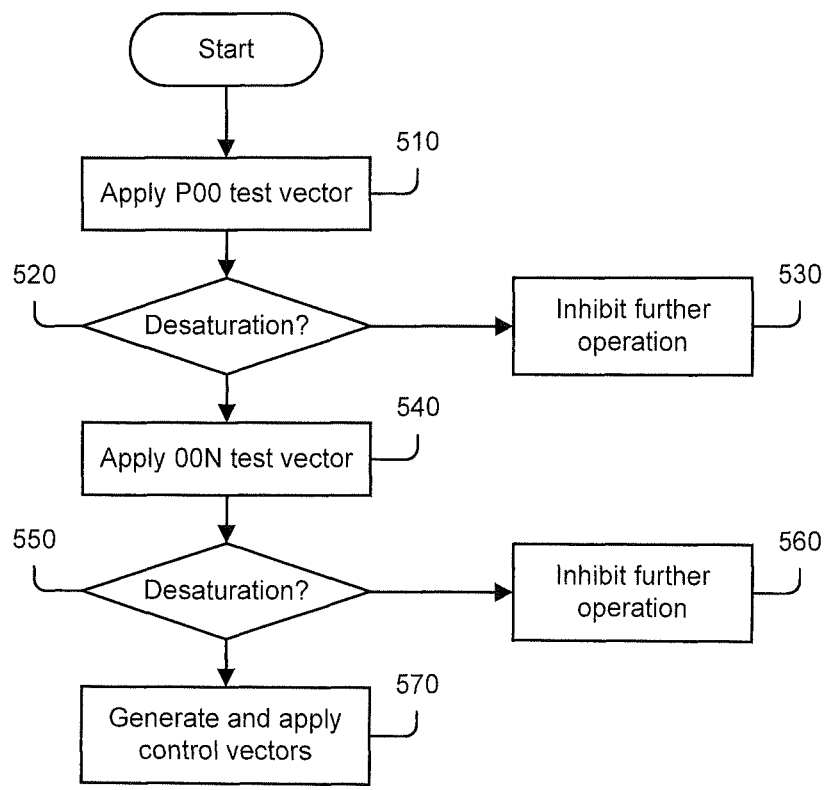
FIG. 5 is a flowchart illustrating operations of the apparatus of FIG. 1 according to further embodiments.

According to some aspects, the at least one test vector may comprise a sequence of test vectors that are configured to detect particular types of fault conditions, e.g., phase-to-phase faults. For example, referring to FIGS. 5 and 6 in conjunction with FIGS. 1 and 2, a startup procedure for an AFD may begin by applying a "P00" test vector, which causes the upper transistors S1a and S2a of the "a" switch leg to be on, while the lower transistors S3a, S4a of the "a" switch leg are off, the inner transistors S2b, S3b, S2c, S3c of the "b" and "c" switch legs are on, and the outer transistors S1b, S4b, S1c, S4c of the "b" and "c" switch legs are off (block 510). This test vector supports conduction of a short circuit current for a phase "a" to phase "b" fault or a phase "a" to phase "c" fault. If desaturation of one of the "on" transistors is detected in response to this test vector, further operation of the inverter may be inhibited (blocks 520, 530). If not, a "00N" test vector is subsequently applied, which causes the lower transistors S3c and S4c of the "c" switch leg to be on, while the upper transistors S1c, S2c of the "c" switch leg are off, the inner transistors S2a, S3a, S2b, S3b of the "a" and "b" switch legs are on, and the outer transistors S1a, S4a, S1b, S4b of the "a" and "b" switch legs are off (block 540). This test vector supports conduction of a short circuit current for a phase "b" to phase "c" fault or a phase "a" to phase "c" fault. If desaturation of one of the "on" transistors is detected, further operation of the inverter may be inhibited (blocks 550, 560). If desaturation is not detected, normal operation may be commenced (block 570).

Figure 6:
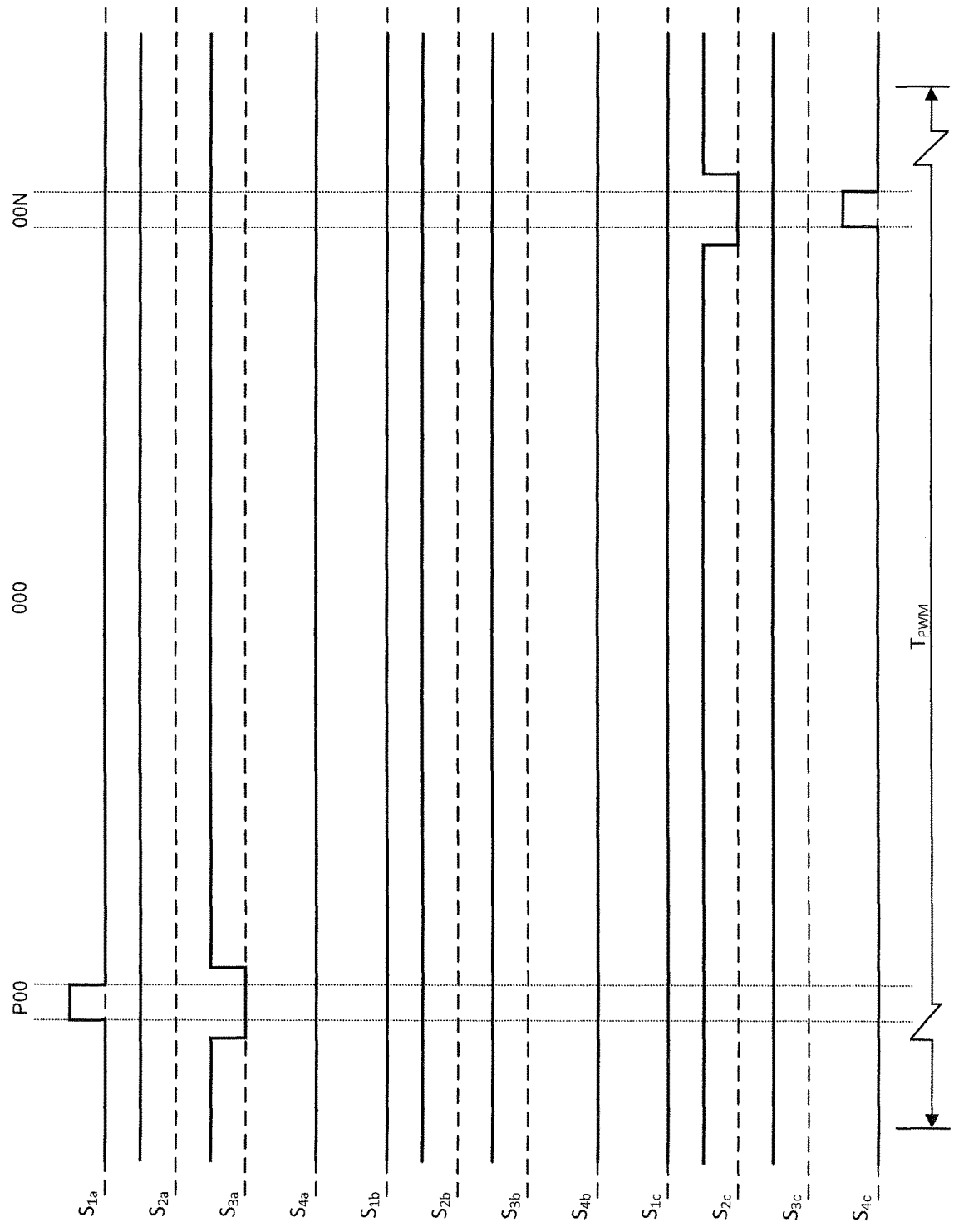
FIG. 6 is a waveform diagram illustrating control signals applied to an inverter of the apparatus of FIG. 1 according to some embodiments.

As illustrated in FIG. 6, the test vectors may be applied one time within a single PWM cycle TPWM, but it will be appreciated that a pair of such vectors could be applied over multiple cycles and/or the same pair of test vectors may be repeated multiple times over multiple PWM cycles. The number and type of test vectors may generally depend on the type of faults being detected, the characteristics of the installation being tested and/or other considerations.

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:

1. An apparatus comprising:
an inverter configured to be connected to a load;
a driver having an output coupled to control terminals of transistors of the inverter and a control input configured to receive control vectors, the driver configured to apply control signals to control terminals of the inverter responsive to the received control vectors;
a desaturation detector configured to detect desaturation of the transistors; and
a controller coupled to the control input of the driver and configured to apply the control vectors to the control input of the driver responsive to a command input and an output feedback, the controller further configured to apply at least one test vector to the control input of the driver that causes the driver to turn on selected ones of the transistors to create a fault current path for a potential fault of at least one phase of an output of the inverter for a duration that is independent of the command input and the output feedback and to enable or inhibit further operation of the inverter responsive to an output of the desaturation detector that occurs in response to the at least one test vector, wherein the controller is configured to apply spaced-apart first and second test vectors to the driver that turn on respective first and second groups of the transistors and to inhibit further operation of the inverter in response to the desaturation detector detecting desaturation of at least one transistor of the first and second groups, wherein the first test vector enables detection of a fault between a first phase and a second phase or a fault between the first phase and a third phase, and wherein the second test vector enables detection of a fault between the third phase and the second phase or a fault between the third phase and the first phase.

2. The apparatus of claim 1, wherein the controller is further configured to enable further operation of the inverter responsive to the desaturation detector failing to detect desaturation of at least one of the transistors of the first and second groups in response to the first and second test vectors.

3. The apparatus of claim 1:
wherein the inverter comprises a three-level inverter comprising first, second and third legs, each comprising first, second, third and fourth transistors coupled between first and second DC buses, respective ones of the first, second and third legs coupled to respective first, second and third phases.

4. The apparatus of claim 1, wherein the controller is configured to generate control vectors of varying duration to vary a voltage produced at the load responsive to the desaturation detector failing to detect desaturation of at least one of the transistors in response to the test vector.

5. The apparatus of claim 1, wherein the controller is a pulse width modulated (PWM) controller configured to apply vectors that produce a periodic switching cycle, and wherein application of the at least one test vector is limited to a single switching cycle.

6. The apparatus of claim 1, wherein the load is a motor and wherein the controller is configured to apply the at least one test vector responsive to a command to start the motor.

7. A method of operating an adjustable frequency drive comprising an inverter configured to be connected to first, second and third phases of a load, a driver having an output coupled to control terminals of transistors of the inverter and a control input configured to receive control vectors and configured to responsively apply control signals to control terminals of the inverter, a controller configured to apply control vectors to the driver responsive to a command input and an output feedback, and a desaturation detector configured to detect desaturation of transistors of the inverter, the method comprising:

the controller applying at least one test vector to the control input of the driver that causes the driver to turn on selected ones of the transistors of the inverter to create a fault current path for a potential fault of at least one phase of the output of the inverter for a test interval having a duration that is independent of the command input and the output feedback, including applying spaced-apart first and second test vectors to the driver that turn on respective first and second groups of the transistors, wherein the first test vector enables detection of a fault between a first phase and a second phase or a fault between the first phase and a third phase, and wherein the second test vector enables detection of a fault between the third phase and the second phase or a fault between the third phase and the first phase; and enabling or disabling further operation of the inverter responsive to an output of the desaturation detector that occurs in response to the at least one test vector, wherein further operation of the inverter is inhibited in response to the desaturation detector detecting desaturation of at least one transistor of the first and second groups.

8. The method of claim 7, comprising enabling further operation of the inverter responsive to the desaturation detector failing to detect desaturation of at least one of the transistors of the first and second groups in response to the first and second test vectors.

9. The method of claim 7:
    wherein the inverter comprises a three-level inverter comprising first, second and third legs, each comprising first, second, third and fourth transistors coupled between first and second DC buses, respective ones of the first, second and third legs coupled to respective first, second and third output phases.

10. The method of claim 7, comprising the controller applying control vectors of varying duration to vary a voltage produced by the inverter responsive to the desaturation detector failing to detect desaturation of at least one of the transistors in response to the test vector.

11. The method of claim 7, wherein the load is a motor and wherein the at least one test vector is applied responsive to a command to start the motor.

12. A computer program product comprising a non-transitory computer-readable medium having computer program instructions stored therein that, when executed on a processor, performs the method of claim 7.

\* \* \* \* \*